US010018970B2

(12) United States Patent
Chuang et al.

(10) Patent No.: US 10,018,970 B2
(45) Date of Patent: Jul. 10, 2018

(54) TIME-TO-DIGITAL SYSTEM AND ASSOCIATED FREQUENCY SYNTHESIZER

(71) Applicant: MEDIATEK Inc., Hsin-Chu (TW)

(72) Inventors: Yun-Chen Chuang, Hsinchu (TW); Ang-Sheng Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/244,132

(22) Filed: Aug. 23, 2016

(65) Prior Publication Data

US 2017/0090426 A1   Mar. 30, 2017

Related U.S. Application Data

(60) Provisional application No. 62/234,905, filed on Sep. 30, 2015.

(51) Int. Cl.
*H03L 7/06* (2006.01)
*G04F 10/00* (2006.01)
*H03L 7/085* (2006.01)
*H03L 7/16* (2006.01)

(52) U.S. Cl.
CPC .......... *G04F 10/005* (2013.01); *H03L 7/085* (2013.01); *H03L 7/16* (2013.01); *H03L 2207/50* (2013.01)

(58) Field of Classification Search
CPC ....... H03L 7/091; H03L 7/093; H03L 7/0991; G04F 10/005
USPC ........................................................ 327/158
See application file for complete search history.

(56) References Cited

U.S. PATENT DOCUMENTS

| 8,090,068 B2 | 1/2012 | Sun et al. | |
| 8,433,025 B2* | 4/2013 | Sun | H03L 7/0802 327/156 |
| 8,558,728 B1* | 10/2013 | Lemkin | G01R 31/31709 341/155 |
| 9,037,886 B2 | 5/2015 | Cho et al. | |
| 2006/0103566 A1* | 5/2006 | Vemulapalli | G04F 10/005 341/155 |
| 2009/0175399 A1* | 7/2009 | Sun | H03L 7/0802 375/376 |
| 2013/0093469 A1* | 4/2013 | Lin | H03L 7/081 327/107 |
| 2016/0056827 A1* | 2/2016 | Vlachogiannakis | H03B 5/1265 327/158 |

(Continued)

*Primary Examiner* — Ryan Jager
(74) *Attorney, Agent, or Firm* — McClure, Qualey & Rodack, LLP

(57) ABSTRACT

A time-to-digital system and associated frequency synthesizer are provided. The time-to-digital system receives a reference clock and a variable clock. The time-to-digital system includes a supplement circuit and a time-to-digital converter (TDC). The supplement circuit generates a delayed reference clock signal and at least one pulse of a variable clock ahead of a transition of the delayed reference clock signal. The delayed reference clock signal is generated according to a delay control signal and the reference clock signal. The delay control signal is determined in response to transitions of the variable clock, and frequency of the variable clock is significantly higher than frequency of the reference clock signal. Being coupled to the supplement circuit, the TDC receives the delayed reference clock signal and the at least one pulse of the variable clock and accordingly produces a TDC signal.

20 Claims, 9 Drawing Sheets

(56) References Cited

U.S. PATENT DOCUMENTS

2016/0103423 A1* 4/2016 Chang .................. G04F 10/005
                                                    341/118
2016/0373120 A1* 12/2016 Caffee .................... H03L 7/091

* cited by examiner

TIME-TO-DIGITAL SYSTEM AND ASSOCIATED FREQUENCY SYNTHESIZER

This application claims the benefit of U.S. provisional application Ser. No. 62/234,905, filed Sep. 30, 2015, the disclosure of which is incorporated by reference herein in its entirety.

TECHNICAL FIELD

The disclosure relates in general to a time-to-digital system and associated frequency synthesizer, and more particularly, to a time-to-digital system and associated frequency synthesizer capable of reducing hardware complexity, lowering power consumption, suppressing supply interference, reducing layout area and enhancing linearity, etc.

BACKGROUND

A core technique for modern communication systems is frequency (and/or clock) synthesis, and the phase-locked loops (hereinafter, PLL) have been widely employed in frequency synthesis. The PLL is basically a self-correcting control system in which one signal chases another signal. For example, the PLL can synchronize frequency of a voltage-controlled oscillator (hereinafter, VCO) to a reference clock signal (hereinafter, FREF) through feedback. The frequency and phase of the output clock generated from the PLL are very stable. Recently, digital PLLs (hereinafter, DPLL) have been implemented and adopted in digital communications.

Many DPLLs rely on a time-to-digital converter (hereinafter, TDC) to perform phase detection. In general, the TDC quantizes time difference between two input signals, a reference clock signal (FREF) and a variable clock (CKV), and accordingly generates a difference signal. Basically, the detected result and the output of the TDC may dominate the adjustment of a digitally controlled oscillator (hereinafter, DCO). Thus, the TDC is a critical component in DPLL, and ensuring linearity, precision and resolution of the TDC becomes an important issue.

SUMMARY

The disclosure is directed to a time-to-digital system and associated frequency synthesizer. The time-to-digital system and associated frequency synthesizer are capable of being flexibly adjusted in response to a frequency change of a variable clock and/or a reference clock.

According to one embodiment, a time-to-digital system is provided. The time-to-digital system receives a reference clock signal and a variable clock, and includes a supplement circuit and a time-to-digital converter. Frequency of the variable clock is significantly higher than frequency of the reference clock signal. The supplement circuit generates a delayed reference clock signal and at least one pulse in response to the variable clock ahead of a transition of the delayed reference clock signal. The delayed reference clock signal is generated according to the reference clock signal and a delay control signal which is determined in response to transitions of the variable clock. The TDC is coupled to the supplement circuit. The TDC receives the delayed reference clock signal and the at least one pulse in response to the variable clock and accordingly produces a TDC signal.

According to another embodiment, a frequency synthesizer is provided. The frequency synthesizer includes a supplement circuit and a time-to-digital converter (TDC). The supplement circuit generates a delayed reference clock signal and at least one pulse in response to a variable clock ahead of a transition of the delayed reference clock signal. The delayed reference clock signal is generated according to a reference clock signal and a delay control signal which is determined in response to transitions of the variable clock, and frequency of the variable clock is significantly higher than frequency of the reference clock signal. The TDC is coupled to the supplement circuit. The TDC receives the delayed reference clock signal and the at least one pulse in response to the variable clock and accordingly produces a TDC signal.

Figure 1:
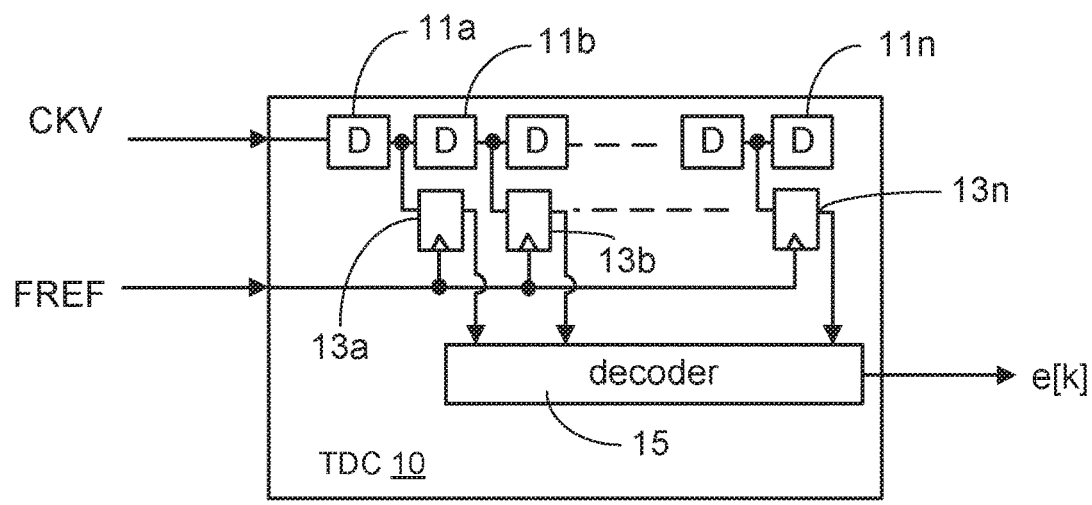
FIG. 1 is a schematic diagram illustrating a TDC.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a schematic diagram illustrating a TDC. The TDC 10 typically includes a chain of delay elements (for example, inverters) 11a, 11b ... 11n, a plurality of D flip-flops 13a, 13b ... 13n, and a decoder 15. After receiving a reference clock signal (FREF) and a variable clock (CKV), the TDC 10 outputs a TDC signal, that is, e[k], whose value is proportional to a phase difference between its two input signals. In practical application, frequency of the variable clock ($f_{CKV}$) is significantly higher than frequency of the reference clock signal ($f_{FREF}$). For example, the reference clock signal (FREF) has a frequency of 26 MHz or 52 MHz, while the variable clock (CKV) has a frequency of 8 GHz or 12 GHz.

Figure 2:
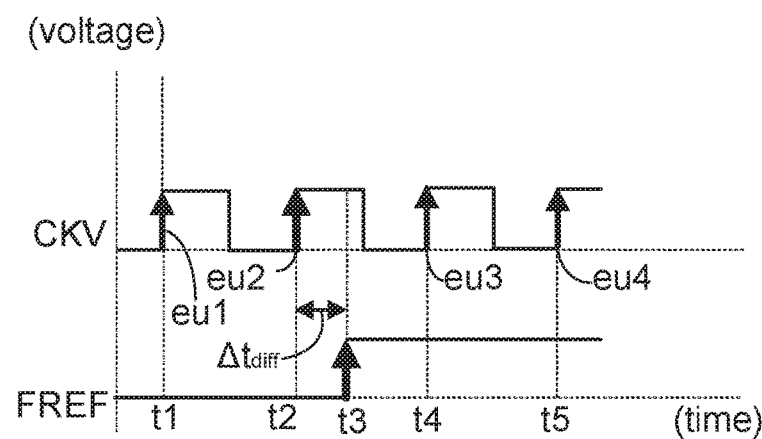
FIG. 2 is a schematic diagram illustrating the time (phase) difference between a reference clock (FREF) and a variable clock (CKV).

FIG. 2 is a schematic diagram illustrating time difference between a rising edge of the reference clock signal (FREF) and a rising of the variable clock (CKV). As shown in FIG. 2, among the four rising edges (eu1, eu2, eu3, eu4) of the variable clock (CKV) which are nearby a rising edge of the reference clock signal (FREF), the TDC only selects the last rising edge of the variable clock (CKV) ahead of a significant transition of the reference clock signal (FREF). For example, in FIG. 2, the second rising edge of the variable clock (CKV), eu2, is compared with the rising edge of the reference clock signal (FREF) to obtain a time interval. Consequentially, the TDC produces a TDC signal to digitally represent the time interval ($\Delta t_{diff}$=|t3−t2|).

To avoid mistakenly select the rising edge which is not the last pulse of the variable clock (CKV) occurs right before the rising edge of the pulse of the reference clock (FREF), a concept of a filter window can be utilized. The filter window is used to suppress the redundant pulses of the variable clock (CKV) which are not close to the rising edge of the reference clock signal (FREF). According to an embodiment of the present disclosure, a supplement circuit for suppressing the redundant pulses of the variable clock (CKV) is provided.

Figure 3:
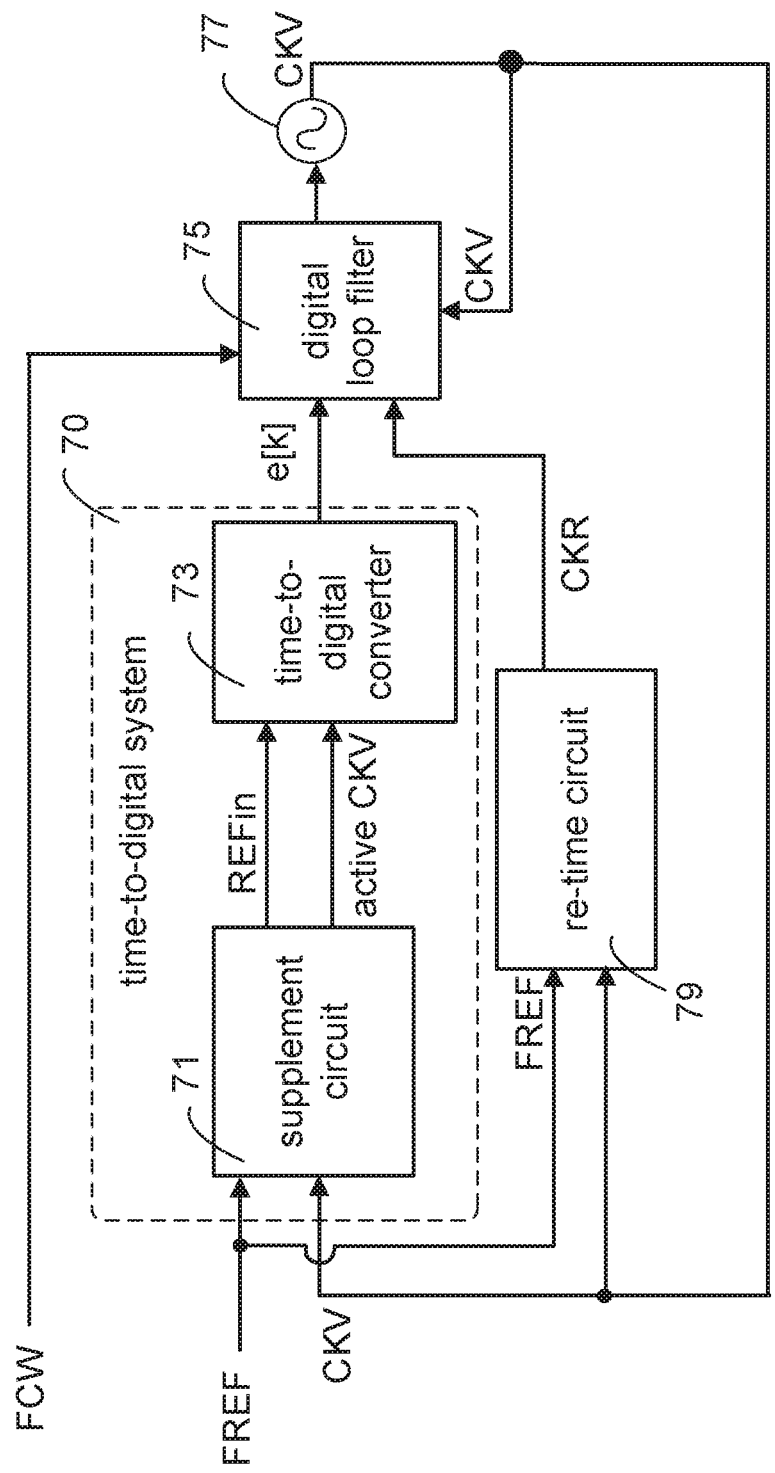
FIG. 3 is a schematic diagram illustrating a PLL circuit using the supplement circuit and the TDC.

FIG. 3 is a block diagram schematically illustrating a DPLL circuit within which the supplement circuit and the TDC may be embodied or carried out. The DPLL circuit can be employed as frequency synthesizer in radio frequency circuits to create a stable yet tunable local oscillator for transmitters and receivers due to its low power consumption and high integration level. The DPLL circuit has several digital devices, such as the time-to-digital system 70 including a supplement circuit 71 and a TDC 73, a digital loop filter (LPF) 75, a DCO 77, a re-time circuit 79, and other digital devices.

A frequency command word (FCW) multiple represents a divider control, and the re-time circuit 79 is used for re-synchronization. Being used to replace the VCO, the DCO 77 generates a symmetrical variable clock (CKV) whose frequency and phase are compared with those of the reference clock signal (FREF). Both the supplement circuit 71 and the re-time circuit 79 receive the reference clock signal (FREF) and the variable clock (CKV). The re-time circuit 79 provides a re-timed reference clock signal (hereinafter, CKR) by re-timing the reference clock signal (FREF) at significant transitions of the variable clock (CKV). Each significant transition of the re-timed reference clock signal (CKR) aligns with a significant transition of the variable clock (CKV).

The DCO 77 generates the variable clock (CKV) in response to a control signal sent from the digital loop filter 75. The digital loop filter 75 generates the control signal based on the variable clock (CKV), the FCW multiple, the re-timed reference clock signal (CKR) and the TDC signal (e[k]). The frequency of the variable clock (CKV) is the FCW multiple of the reference clock signal (FREF) when the variable clock (CKV) reaches a lock with the reference clock signal (FREF).

According to the embodiment of the present disclosure, the supplement circuit 71 provides a filter window for suppressing pulses of the variable clock (CKV). In short, the filter window can reduce the number of pulses of the variable clock (CKV) being transmitted to the TDC 73. Consequentially, the performance and the power consumption of the TDC 73 can be improved because unnecessary pulses of the variable clock (CKV) are removed in advance. Furthermore, the supplement circuit 71 may be used together with various types of the TDC 73, such as a buffer delay line TDC, an inverter delay line TDC, a gated ring oscillator TDC, a Vernier TDC, a Vernier Ring TDC, a parallel TDC and so forth.

As shown in FIG. 3, the functionality of PLL is not affected by insertion of the supplement circuit 71. The supplement circuit 71 receives the reference clock signal (FREF) and the variable clock (CKV) and generates two outputs to the TDC 73. For the sake of illustration, the outputs of the supplement circuit 71 are respectively defined as a delayed reference clock signal (REFin) and a filtered variable clock (active CKV). The filtered variable clock (active CKV) represents at least one pulse of the variable clock ahead of a significant transition of the delayed reference clock signal (REFin). Alternatively speaking, the filtered variable clock (active CKV) is corresponding to the pulse(s) of the variable clock (CKV) within duration of pulse of the filter window.

Being used in the DPLL circuit, a low-dropout (hereinafter, LDO) regulator receives a supply voltage (for example, 1.8 V) from a voltage source, and outputs an operation voltage (for example, 1.2V) to the TDC 73 and the DCO 77. The pulse width of the filter window causes fluctuation of the operation voltage of the LDO (LDO output voltage). Therefore, the supplement circuit 71 needs to select an appropriate pulse width of the filter window. Otherwise, performance and power consumption of the TDC 73 can be affected.

Figure 4A:
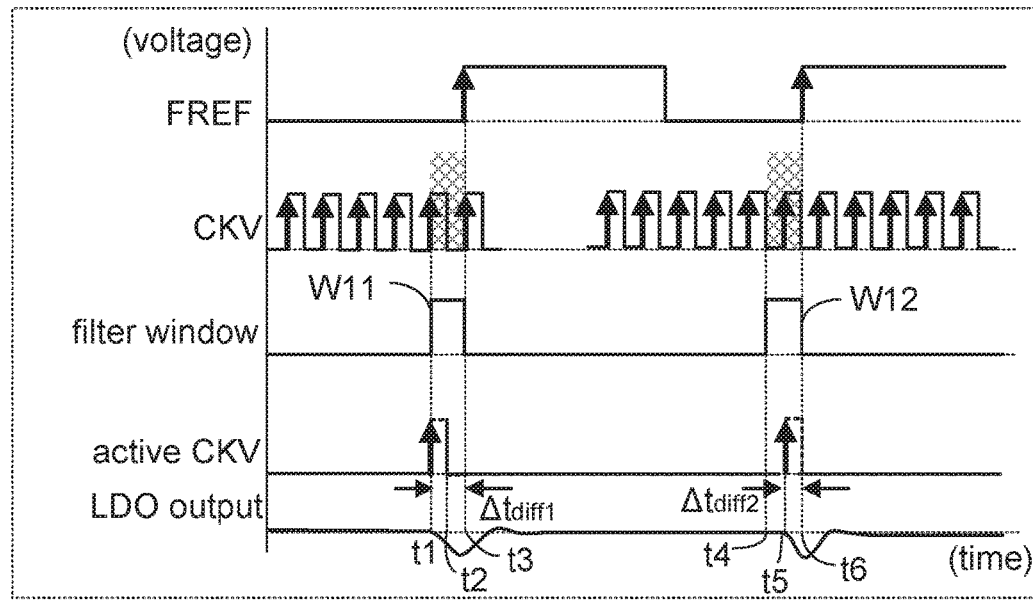
FIG. 4A is a schematic diagram illustrating the LDO output voltage is slightly affected by a window having a relatively narrow width.
Figure 4B:
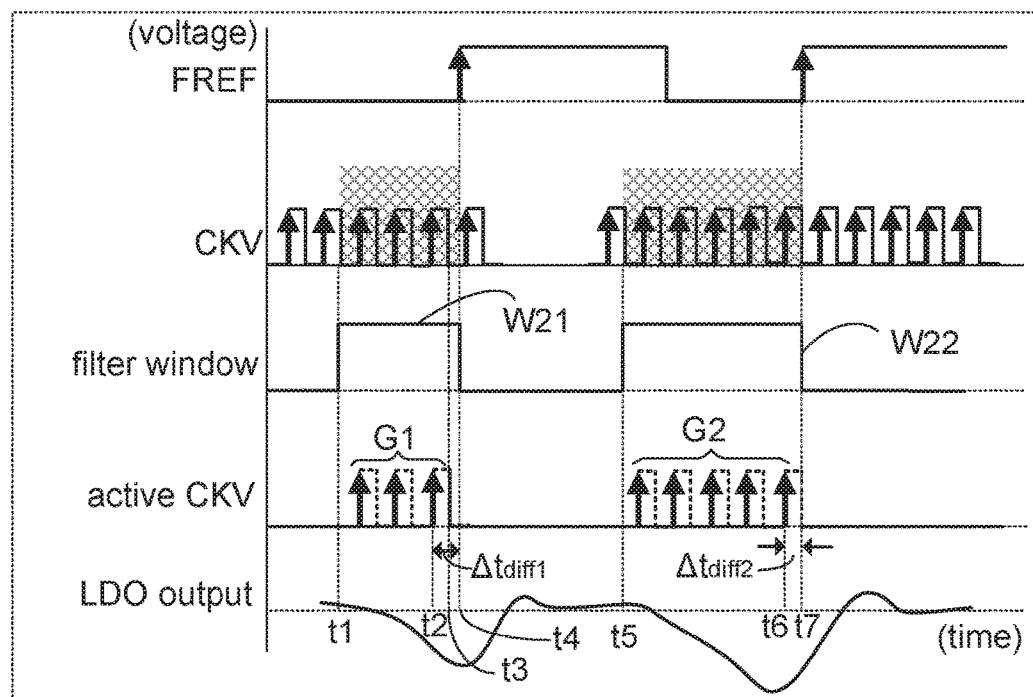
FIG. 4B is a schematic diagram illustrating LDO output voltage is significantly affected by a window having a relatively wide width.

In FIGS. 4A and 4B, importance of selecting a pulse width of the filter window is described. The supplement circuit 71 is assumed to receive two sets of identical reference clock signal (FREF) and variable clock (CKV) in FIGS. 4A and 4B. Whereas, the pulse width of the filter windows in FIG. 4B is assumed to be wider than that in FIG. 4A. For the sake of comparison, in FIGS. 4A and 4B, pulse width of the filter windows is represented as mesh-like shading.

FIG. 4A is a schematic diagram illustrating LDO output voltage is slightly affected by a filter window having a relatively narrow width. In FIG. 4A, two filter windows having a narrow width are shown.

The first filter window (W11) rises from a first level (low level) to a second level (high level) at a time point t1 and falls from the second level to the first level at a time point t3. The falling edge of the first filter window (W11) is consistent with the rising edge of the first (left) pulse of the reference clock signal (FREF). The second filter window (W12) rises from the first level to the second level at a time point t4, and falls from the second level to the first level at a time point t6. The falling edge of the second filter window (W12) is consistent with the rising edge of the second (right) pulse of the reference clock signal (FREF).

A pulse of the variable clock (CKV) is included by the first filter window (W11). The pulse of the variable clock (CKV), received in duration between the time point t1 and a time point t2, is regarded as a first filtered variable clock pulse (the left pulse of the active CKV shown in FIG. 4A). Another pulse of the variable clock (CKV) signal is included by the second filter window W12. The another pulse of the variable clock (CKV), received in duration between a time point t5 and the time point t6, is regarded as a second filtered variable clock pulse (the right pulse of the active CKV shown in FIG. 4A).

As shown in FIG. 4A, the rising edge of the first pulse of the filtered variable clock (active CKV) and the rising edge of the first (left) pulse of the reference clock signal (FREF)

jointly determine a first time difference ($\Delta t_{diff1}$), and the rising edge of the second pulse of the filtered variable clock (active CKV) and the rising edge of the second (right) pulse of the reference clock signal (FREF) jointly determine a second time difference ($\Delta tf_2$). The rising edge of the first (left) pulse of the reference clock signal (FREF) occurs at the time point t3, and the rising edge of the second (right) pulse of the reference clock signal (FREF) occurs at the time point t6. Therefore, the TDC 73 will detect the first time difference ($\Delta t_{diff1}$) which is equivalent to duration between the time point t1 and the time point t3 ($\Delta t_{diff1}$=t3−t1). Moreover, the TDC 73 will detect the second time difference $\Delta t_{diff2}$ is equivalent to duration between the time point t5 and the time point t6 ($\Delta t_{diff2}$=t6−t5).

In FIG. 4A, the LDO output voltage slightly drops in duration between the time point t1 and the time point t3, and duration between the time point t5 and the time point t6. In practical application, the LDO output voltage may be affected by the number of pulses of the filtered variable clock (active CKV).

FIG. 4B is a schematic diagram illustrating LDO output voltage is significantly affected by a filter window having a relatively wide width. In FIG. 4B, two filter windows (W21 and W22) having a wide width are shown. The first (left) filter window W21 in FIG. 4B is assumed to be wider than the first (left) filter window (W11) in FIG. 4A; and the second (right) filter (W22) in FIG. 4B is assumed to be wider than the second (right) window (W12) in FIG. 4A.

The first (left) filter window (W21) rises from the first level to the second level at a time point t1, and falls from the second level to the first level at a time point t4. The falling edge of the first filter window (W11) is consistent with the rising edge of the first (left) pulse of the reference clock signal (FREF). The second filter window (W22) rises from the first level to the second level at a time point t5, and falls from the second level to the first level at a time point t7. The falling edge of the second filter window (W22) is consistent with the rising edge of the second (right) pulse of the reference clock signal (FREF). The first filter window (W21) is corresponding to three pulses of the filtered variable clock (the pulses of the active CKV represented as group G1 in FIG. 4B), and the second filter window (W22) is corresponding to five pulses of the filtered variable clock (the pulses of the active CKV represented as group G2 in FIG. 4B).

Even if there are more than one pulse of the filtered variable clock (active CKV) being included by the filter window, only the rising edge of the last pulse among the filtered variable clock (active CKV) ahead the rising edge of the reference clock signal (FREF) is selected as the input of the TDC 73. That is, the rising edge of the pulse of the filtered variable clock (active CKV), which occurs prior to and is the closest to the rising edge of the reference clock signal (FREF), is selected and compared with the rising edge of the reference clock signal (FREF) by the TDC 73. For example, the rising edge of the pulse of the filtered variable clock (active CKV) occurs at a time point t3 and a time point t6 are selected and compared.

For the sake of illustration, the pulse of the filtered variable clock (active CKV) being received by the TDC 73 is further defined as a target variable clock (CKVin). Thus, in FIG. 4B, only the third pulse of the filtered variable clock (active CKV) in group G1, and the fifth pulse of the filtered variable clock (active CKV) in group G2 are selected as the target variable clock (CKVin).

The first pulse of the target variable clock (CKVin), that is, the third pulse of the filtered variable clock (active CKV) in group G1, transits from the first level to the second level at a time point t2, and transits from the second level to the first level at the time point t3. The TDC 73 measures a first time difference ($\Delta t_{diff1}$) representing duration between the rising edge of the first pulse of the target variable clock (CKVin) (occurs at the time point t2), and the first rising edge of the reference clock signal (FREF) (occurs at the time point t4), that is, $\Delta t_{diff1}$=t4−t2.

The second pulse of the target variable clock (CKVin), that is, the fifth pulse of the filtered variable clock (active CKV) in group G2, transits from the first level to the second level at the time point t6, and transits from the second level to the first level at the time point t7. The TDC 73 measures a second time difference ($\Delta t_{diff2}$) representing duration between the rising edge of the second pulse of the target variable clock (CKVin) (occurs at the time point t6), and the second rising edge of the reference clock signal (FREF) (occurs at the time point t7), that is, $\Delta t_{diff2}$=t7−t6.

In FIG. 4B, the reference clock signal (FREF) and the variable clock (CKV) are identical to the ones in FIG. 4A. Therefore, the durations of the first time differences $\Delta t_{diff1}$ in FIG. 4A and FIG. 4B are equivalent to each other, so as the second time differences $\Delta t_{diff2}$ in FIG. 4A and FIG. 4B. The pulse width of the filter window in FIGS. 4A and 4B are different. When the pulse width of the filter window increases, number of pulses of the filtered variable clock (active CKV) is increased.

As shown in FIG. 4B, the LDO output voltage significantly drops in duration between the time point t1 and the time point t4, and in duration between the time point t5 to the time point t7. The duration between the time point t1 and the time point t4 is substantially equivalent to the duration (width) of pulse of the first filter window W21, and the duration between the time point t5 and the time point t7 is substantially equivalent to the duration (width) of pulse of the second filter window W22. Obviously, these two ranges of significant LDO output voltage droppings are positively related to generation of the two filter windows. Because the two filter windows are not directly transmitted to the TDC 73, the influences caused by the two filter windows are indirect.

The pulses of the filtered variable clock (active CKV) are transmitted to the TDC 73 as its input. As illustrated above, the pulses of the filtered variable clock (active CKV) are generated based on the filter window and the variable clock (CKV). The significant transitions of the filtered variable clock (active CKV) highly interferes the operation of the TDC 73, whose operation voltage is strongly dependent on the LDO output voltage. Therefore, the frequent transition of the filtered variable (active CKV) may result in fluctuation of the LDO output. Alternatively speaking, when more pulses of the filtered variable clock (active CKV) are left or generated by the filter window and transmitted to the TDC 73, the LDO output voltage drops more. In some occasions, the dropping of the LDO output voltage may reach 50 mV, which is intolerable for the TDC 73 in high speed applications.

In short, the pulse width of the filter window dominates the amount of pulses of the filtered variable clock (active CKV) to be transmitted to the TDC 73, and the pulses of the filtered variable clock (active CKV) are the ones causing the dropping of the LDO output voltage. In consequence, the operation of the TDC 73 can be seriously affected and the plural delay elements in the TDC 73 have to operate at a lower voltage level. As a result, less current may flow through the delay elements in the TDC 73 and extra delay duration occurs in between the delay elements. Therefore, the resolution and linearity of the TDC 73 will degrade if the LDO output voltage drops. Comparing FIGS. 4A and 4B, it can be found that the more unnecessary CKV signals are received by the TDC 73, the more power consumption are wasted, and the resolution of the TDC 73 degrades.

In order to save power consumption and maintain resolution of the TDC 73, the supplement circuit capable of generating well-calibrated filter window is provided. The concurrent communication devices may integrate different communication protocols so that the DPLL circuit may be used for synthesizing signals having different frequencies. That is to say, frequencies of the variable clock (CKV) and the reference clock signal (FREF) to be synthesized may vary. Consequentially, a well-calibrated window may suit for a set of the first variable clock (CKV1) and the first reference clock signal (FREF1) but not suit for another set of the second variable clock (CKV2) and the second reference clock signal (FREF2). Therefore, the selection of the pulse width of the filter window changes the performance of the TDC 73, and the pulse width of the filter window needs to be dynamically calibrated and adjusted so that an appropriate width can be determined in response to change of the reference clock signal (FREF) and the variable clock (CKV).

Figure 5A:
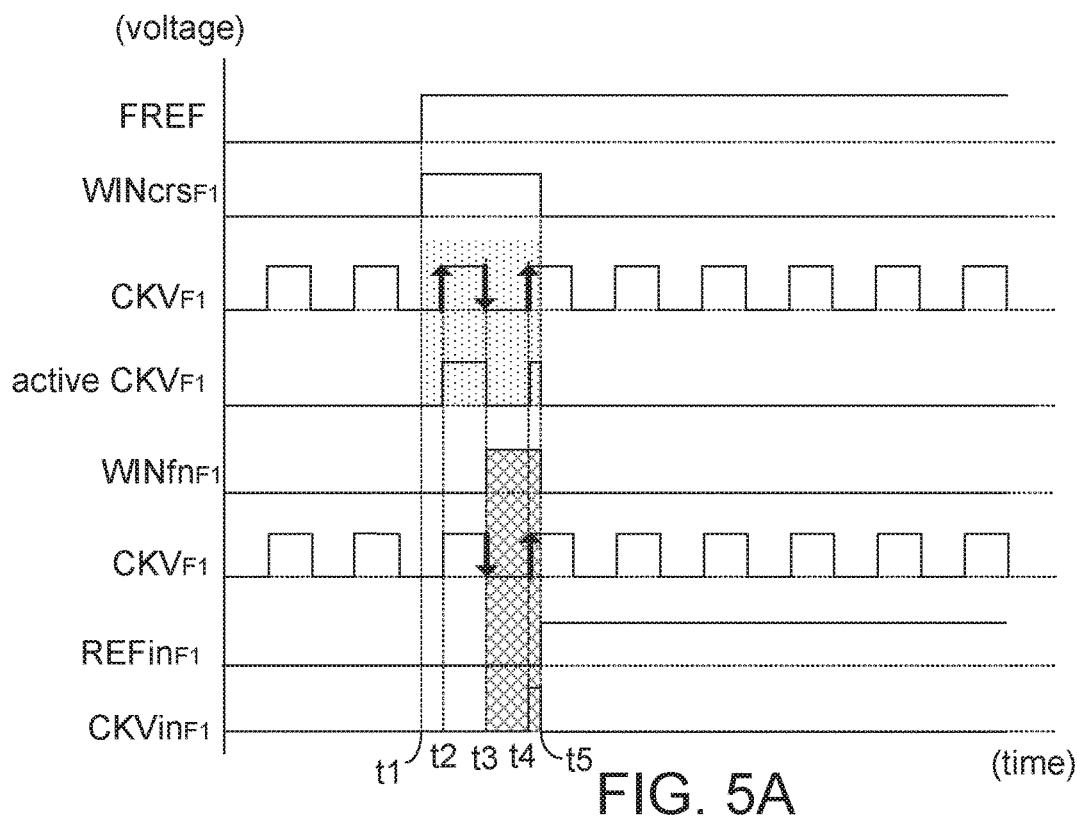
FIG. 5A is a schematic diagram illustrating applying two adjustment stage of window width to a combination of reference clock signal and a variable clock having a lower frequency.
Figure 5B:
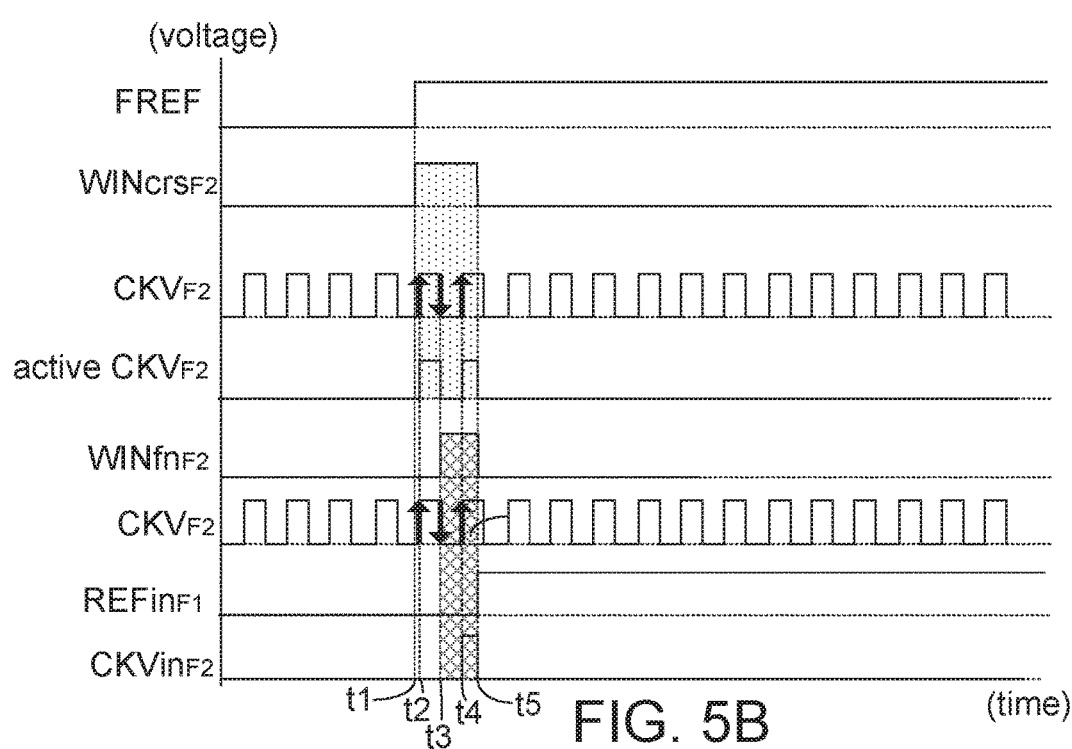
FIG. 5B is a schematic diagram illustrating applying two adjustment stage of window width to a combination of reference clock signal and a variable clock having a higher frequency.

For a brief summary of the above illustrations, the filter window whose pulse width is flexible and adjustable is demanded for development. According to an embodiment of the present disclosure, the question of generating the filter window is transformed to generation of two types of filter window signal, a coarse window signal (first window) and a fine window signal (second window). Both the pulse width of the coarse window signal (WINcrs) and the fine window signal are adjustable. In FIGS. 5A and 5B, purpose, implementation and usage of the coarse window signal (WINcrs) and the fine window signal (WINfn) are illustrated.

In short, the pulse width of the coarse window signal (WINcrs) is firstly determined by the rising edge of the reference clock signal (FREF) and a delay control signal (DLYctrl). The pulse width of the fine window signal (WINfn) is determined based on the pulse width of the coarse window signal (WINcrs) and the variable clock (CKV). Details about calibrating the pulse width of the fine window signal (WINfn), and generation of both the coarse window signal (WINcrs) and the fine window signal (WINfn) will be illustrated later.

The operation of the supplement circuit 71 can be defined as a calibration mode and a normal operation mode. The pulse width of the coarse window signal (WINcrs) is dynamically adjusted in the calibration mode and remains unchanged in the normal operation mode. The pulse width of the fine window signal (WINfn) is determined according to the coarse window signal (WINcrs) and a falling edge of the pulse of the variable clock (CKV).

As mentioned above, when either a frequency of the reference clock signal (FREF) or a frequency of the variable clock (CKV) changes, the supplement circuit 71 needs to detect and update a new pulse width of the coarse window signal (WINcrs) and the supplement circuit 71 enters the calibration mode. In consequence, the pulse width of the coarse window signal (WINcrs) will repeatedly be adjusted until a predefined condition is satisfied.

The predefined condition is determined to be satisfied or not based on the number of significant transitions (for example, rising edges and falling edges) of the variable clock (CKV) generated in duration of pulse of the coarse window signal (WINcrs). The number of significant transitions of the variable clock (CKV) generated in duration of pulse of the coarse window signal (WINcrs) is counted by a high speed counter to obtain a counting value (QALL). The predefined condition is determined to be satisfied based on the type of the high speed counter and comparison between a threshold value (CNTth) and the counting value (QALL). When the predefined condition is determined to be satisfied, the supplement circuit 71 exits the calibration mode and enters the normal mode.

The initiation of a calibration procedure may be caused by automatically detection or setting of the firmware. In some applications, the DPLL circuit may be used to support relatively simple protocol. Thus, the supplement circuit 71 may operate in the calibration mode whenever the DPLL circuit is turned on, and the supplement circuit 71 remains to operate in the normal operation mode after the calibration procedure is complete. In some other applications, the DPLL circuit may be designed to support different communication systems so that the DPLL circuit is required to be able to synthesize signals having different frequencies. In such case, the supplement circuit 71 is designed to operate in the calibration mode whenever a frequency change of the reference clock signal (FREF) and/or the variable clock (CKV) happens.

FIGS. 5A and 5B schematically illustrate the scenario that the predefined condition is assumed to be satisfied. Although the predefined conditions of FIGS. 5A and 5B are assumed to be identical, that is, the counting value (QALL) and the threshold value (CNTth) are both equivalent to "3", the pulse width of the coarse window signal (WINcrs$_{F1}$ and WINcrs$_{F2}$) in FIGS. 5A and 5B are different since frequencies of the variable clocks (CKV$_{F1}$ and CKV$_{F2}$) are different. Details about how the predefined condition is determined as satisfied and the determination of the pulse width of the coarse window signal (WINcrs) will be illustrated later. For illustration purpose, the dotted shading is corresponding to pulse width (duration) of the coarse window signal (WINcrs$_{F1}$ and WINcrs$_{F2}$), and the mesh-like shading is corresponding to width (duration) of pulses of the fine window signal (WINfn$_{F1}$ and WINfn$_{F2}$).

FIG. 5A is a schematic diagram illustrating applying two adjustment stage of window width to a combination of reference clock signal (FREF) and a first variable clock having a first frequency (CKV$_{F1}$). The signals shown in FIG. 5A (from top to bottom) are the reference clock signal (FREF), the pulse of the coarse window signal (WINcrs$_{F1}$) corresponding to the first variable clock (CKV$_{F1}$), the first variable clock (CKV$_{F1}$) being compared with duration of pulse of the coarse window signal (WINcrs), the filtered variable clock (active CKV$_{F1}$) corresponding to the coarse window signal (WINcrs), the pulse of the fine window signal (WINfn$_{F1}$) corresponding to the first variable clock (CKV$_{F1}$), the first variable clock (CKV$_{F1}$) being compared with duration of pulse of the fine window signal (WINfn$_{F1}$), a delayed reference clock signal (REFin$_{F1}$), and the target variable clock (CKVin$_{F1}$), respectively.

In FIG. 5A, the reference clock signal (FREF) transits from a low level to a high level at a time point t1. The reference clock signal (FREF) is delayed for the duration of pulse of the coarse window signal (WINcrs$_{F1}$) to generate the delayed reference clock signal (REFin$_{F1}$). Therefore, duration between the rising edge of the delayed reference clock signal (at a time point t5) and the rising edge of the reference clock signal (at the time point t1) is equivalent to duration of pulse of the coarse window signal (WINcrs$_{F1}$).

The rising edge of the reference clock signal (FREF) defines the beginning of the coarse window signal (WINcrs$_{F1}$). In FIG. 5A, the predefined condition is determined to be satisfied if a counting value (QALL) obtained by an edge counter is equivalent to "3". Therefore, three edges of the variable clock (CKV) can be observed within the duration (range) of pulse of the coarse window signal (WINcrs$_{F1}$). In FIG. 5A, these three edges of the variable clock (CKV) include a rising edge occurs at a time point t2, a falling edge occurs at a time point t3, and another rising edge occurs at a time point t4.

The fine window signal (WINfn $_{F1}$) is jointly determined by the coarse window signal (WINcrs $_{F1}$) and a falling edge of the variable clock (CKV) within the coarse window signal (WINcrs $_{F1}$). As shown in FIG. 5A, the falling edge of CKV signal within the coarse window signal (WINcrs $_{F1}$) occurs at the time point t3. Therefore, the fine window signal (WINfn $_{F1}$) transits from the low level to the high level at the time point t3. The fine window signal ends at the same time point as the coarse window signal (WINcrs $_{F1}$). Thus, the fine window signal (WINfn $_{F1}$) transits from the high level to the low level at a time point t5.

The rising edge of the variable clock (CKV$_{F1}$) in the range of the fine window signal and the falling edge of the fine window signal jointly generates the target variable clock (CKVinF$_1$). The target variable clock (CKVin$_{F1}$) and the delayed reference clock signal (REFin) are transmitted to the TDC 73.

FIG. 5B is a schematic diagram illustrating applying two adjustment stage of window width to a combination of reference clock signal and a variable clock having a higher frequency. The signals shown in FIG. 5B (from top to bottom) are the reference clock signal (FREF), the pulse of the coarse window signal (WINcrs$_{F2}$) corresponding the second variable clock (CKV$_{F2}$), the second variable clock (CKV$_{F2}$) being compared with duration of pulse of the coarse window signal (WINcrs$_{F2}$), the filtered variable clock (active CKV$_{F2}$) corresponding to the coarse window signal (WINcrs), the pulse of the fine window signal (WINfn$_{F2}$) corresponding the second variable clock (CKV$_{F2}$), the second variable clock (CKV$_{F2}$) being compared with duration of the fine window signal (WINfn$_{F2}$), a delayed reference clock signal (REFin$_{F2}$), and the target variable clock (CKVin$_{F2}$), respectively. The generations of the signals shown in FIG. 5B are similar to the ones in FIG. 5A. Therefore, details about the generations of the signals are not repeatedly illustrated.

For illustration purpose, the reference clock signals (FREF) shown in FIG. 5A and FIG. 5B are assumed to be the same. Whereas, the frequency of the first variable clock (CKV$_F$) is lower than the frequency of the second variable clock (CKV$_{F2}$). The pulse width of the coarse window signal (WINcrs$_{F1}$) and the fine window signal (WINfn$_{F1}$) in FIG. 5A are wider than those in FIG. 5B because the pulse width of the coarse window signal (WINcrs) is determined based on number of edges of the CKV signal and frequency of the first variable clock (CKV$_{F1}$) in FIG. 5A is lower. Therefore, when the frequency of the variable clock (CKV) is lower, the pulse width of its corresponding coarse window signal (WINcrs) and fine window signal (WINfn) are wider, and vice versa.

In FIGS. 5A and 5B, the number of pulse(s) of the variable clock (CKV) to be transmitted to the TDC 73 remains consistent (for example, in "1" in FIGS. 5A and 5B) because the pulse width of the coarse window and the fine window can be dynamically changed in correspondence with frequency change of the variable clock (CKV) signal. In some applications, the number of pulse(s) of the variable clock (CKV) being included by the fine window signal (WINfn) and sent to the TDC 73 may be greater than "1". Under such circumstances, the TDC 73 only selects the last rising edge of the variable clock (CKV) ahead of a significant transition of the reference clock signal (FREF) for comparison.

As illustrated above, instead of being passively set a fixed width, the pulse width of the coarse window signal (WINcrs) and the pulse width of the fine window signal (WINfn) in the present embodiment are freely adjustable. Consequentially, the significant transitions caused at the input of the TDC 73 can be reduced, and the dropping of LDO out voltage can be minimized.

Figure 6:
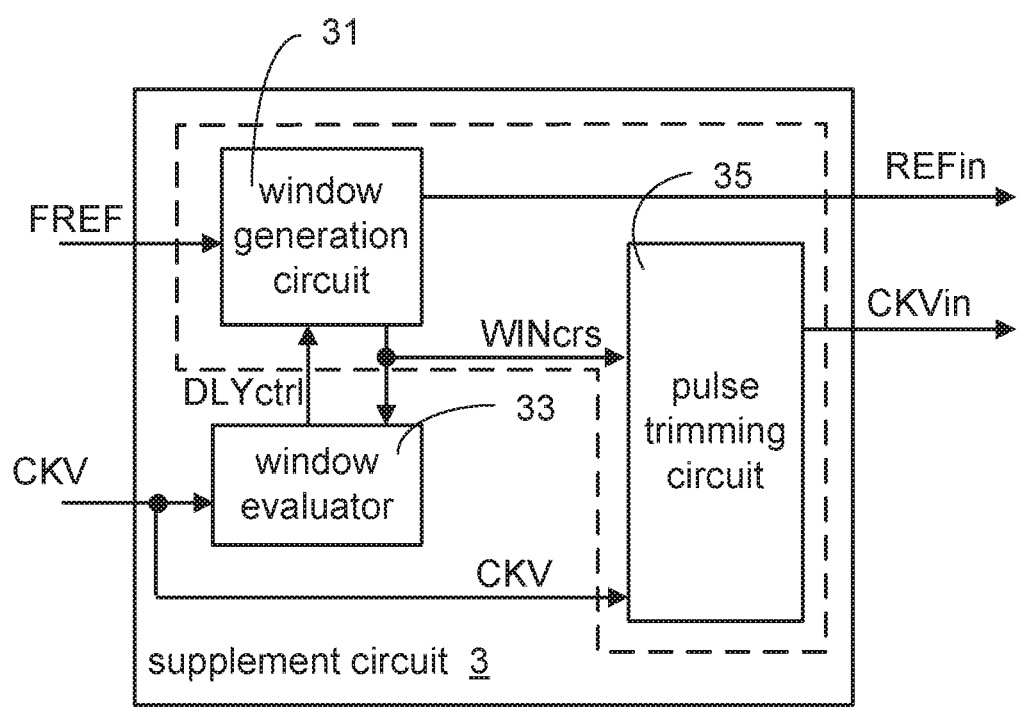
FIG. 6 is a schematic diagram illustrating a supplement circuit.

FIG. 6 is a schematic diagram illustrating a supplement circuit. The supplement circuit 3 is coupled to the TDC (not shown in FIG. 6). According to an embodiment of the present disclosure, the supplement circuit 3 includes a window generation circuit 31, a window evaluator 33 and a pulse trimming circuit 35. The window generation circuit 31, the window evaluator 33 and the pulse trimming circuit 35 are coupled to each other.

When the supplement circuit 3 operates in the normal operation mode, pulse width of the coarse window signal (WINcrs) is not adjusted, and the window evaluator 33 does not need to evaluate the pulse width of the coarse window signal (WINcrs). The dotted line in FIG. 6 shows that only the window generation circuit 31 and the pulse trimming circuit 35 operate in the normal mode.

As illustrated above, the circuitry in the supplement circuit 3 is used to generate two window signals, the coarse window signal (WINcrs) and a fine window signal (WINfn). The coarse window signal (WINcrs) is generated by the window generation circuit 31 and evaluated by the window evaluator 33. The fine window signal (WINfn) is generated by the pulse trimming circuit 35.

The window generation circuit 31 is configured to receive the reference clock signal (FREF) and the variable clock (CKV signal. The window generating circuit 31 delays the reference clock signal (FREF) for a delay duration and accordingly generates the delayed reference clock (REFin). Alternatively speaking, generation of the delayed reference clock (REFin) can be considered as to reproduce the reference clock signal (FREF) after a delay duration. The delayed reference clock (REFin) is transmitted to the TDC. Besides, the window generation circuit 31 generates a coarse window signal (WINcrs) being transmitted to the window evaluator 33 and the pulse trimming circuit 35. The delay duration is equivalent to the pulse width of the coarse window signal (WINcrs).

The window evaluator 33 evaluates the pulse width of the coarse window signal (WINcrs) and generates a delay control signal (DLYctr) to the window generation circuit 31. By receiving the delay control signal (DLYctrl) from the window evaluator 33, the window generation circuit 31 is capable of adjusting the width of the coarse window signal (WINcrs) and the delay duration.

The pulse trimming circuit 35 receives the variable clock (CKV) and the coarse window signal (WIINcrs). Inside the pulse trimming circuit 35, the variable clock (CKV) is filtered by the coarse window signal (WINcrs) so that filtered variable clock (active CKV) signals left. As there may be more than one pulse of the filtered variable clock (active CKV), the pulse trimming circuit 35 further generates the fine window signal to suppress the redundant pulse among pulses of the filtered variable clock (active CKV). The target variable clock (CKVin) is sent to the TDC. After receiving the delayed reference clock (REFin) and the target variable clock (CKVin), the TDC outputs the TDC signal representing the phase difference between the delayed reference clock signal (REFin) and the pulse of the target variable clock (CKVin).

The resolution, dynamic range, nonlinearity and conversion speed are important characteristics to evaluate the TDC. The dynamic range is the total measured range by using the TDC. With the supplement circuit 3, the dynamic range of the TDC becomes more flexible. In addition, both the nonlinearity and the conversion speed of TDC can be improved because the number of significant transitions caused at the input of the TDC is minimized. Consequentially, the use of the supplement circuit 3 can reduce the TDC noise and allow for more simple TDC architectures.

Figure 7:
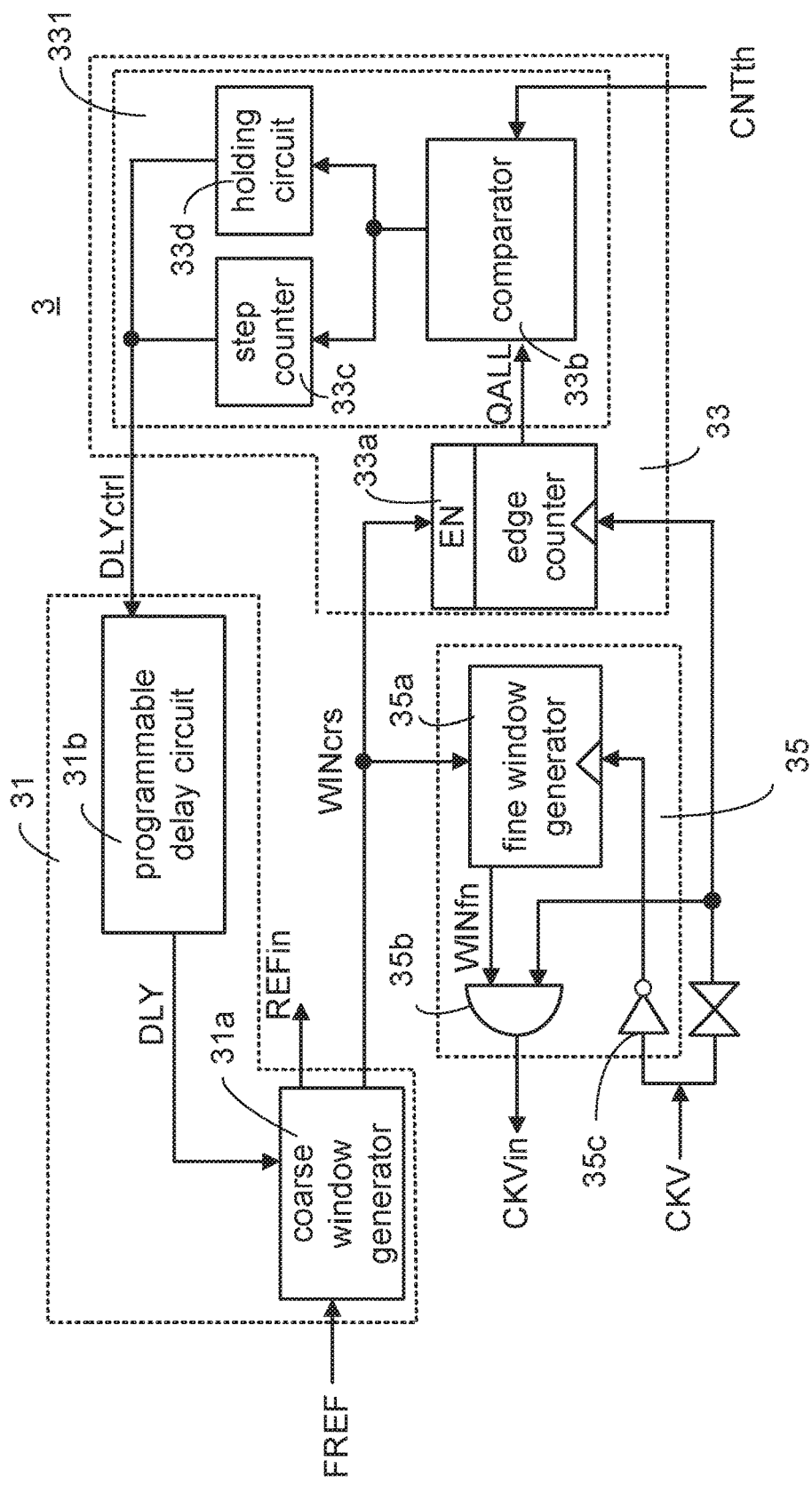
FIG. 7 is a block diagram illustrating signals and components in the supplement circuit.

FIG. 7 is a schematic diagram illustrating blocks in the supplement circuit 3. The window generation circuit 31 includes a coarse window generator 31a and a programmable delay circuit 31b, which are coupled to each other. The window evaluator 33 includes an edge counter 33a and a determination circuit 331, and the determination circuit 331 further includes a comparator 33b, a step counter 33c and a holding circuit 33d. Both the holding circuit 33d and the step counter 33c are coupled to the comparator 33b and the window generation circuit 31. The pulse trimming circuit 35 includes a fine window generator 35a and an AND logic gate 35b, and the fine window generator 35a is coupled to the AND logic gate 35b and the coarse window generator 31a.

Firstly, the operation of the window generation circuit 31 is illustrated. The coarse window generator 31a receives the reference clock signal (FREF) and outputs the delayed reference clock signal (REFin) and the coarse window signal (WINcrs). The coarse window signal (WINcrs) is transmitted to the window evaluator 33 and the pulse trimming circuit 35. The programmable delay circuit 31b outputs the delay count variable (DLY) to the coarse window generator 31a according to the delay control signal (DLYctrl) sent from the window evaluator 33.

The origin of the delay control signal (DLYctrl) can be one of the holding circuit 33d and the step counter 33c. When the supplement circuit 3 is in the calibration mode, the programmable delay circuit 31b receives the delay control signal (DLYctrl) from the step counter 33c until the predefined condition is determined to be satisfied. The programmable delay circuit 31b may receive the delay control signal (DLYctrl) from the holding circuit 33d when the predefined condition is determined as satisfied, or when the supplement circuit 3 is in the normal operation mode.

According to another embodiment of the present disclosure, a delay count variable (DLY) is controlled by the delay control signal (DLYctrl). The delay count variable (DLY) can be stored in a register and the programmable delay circuit 31b fetches the value of the delay count variable (DLY) when receiving the delay control signal (DLYctrl) from the window evaluator 33. If the delay control signal (DLYctrl) is sent from the step counter 33c, the programmable delay circuit 31b fetches the value of the delay count variable (DLY) and changes it with a step value. If the delay control signal (DLYctrl) is sent from the holding circuit 33d, the programmable delay circuit 31b only fetches the delay count variable (DLY).

The delay count variable (DLY) is used for storing a positive integer representing the number of delay units required for generating the delay duration. For example, if the duration of a delay unit is 2 picoseconds and the delay count variable (DLY) is equal to "5", then the delay duration is set to 10 picoseconds (2 picoseconds*5=10 picoseconds).

An initial value of the delay count variable (DLY) is positively related to type of the step counter 33c and can be freely selected. For example, if the step counter 33c operates in an up-counting manner, the initial value of the delay count variable (DLY) may be a smaller positive integer (for example, 1). Whereas, if the step counter 33c operates in a down-counting manner, the initial value of the delay count variable (DLY) may be a greater positive integer (for example, 20).

Based on the delay count variable (DLY) and a unit delay ($\Delta t_{dly}$), the coarse window generator 31a can obtain the delay duration and generate the delayed reference clock signal (REFin) and the coarse window signal (WINcrs). The delayed reference clock signal (REFin) is transmitted to the TDC while the coarse window signal (WINcrs) is transmitted to both the pulse trimming circuit 35 and the window evaluator 33.

Secondly, the operation of the window evaluator 33 is illustrated. The edge counter 33a is a high speed counter being enabled by the coarse window signal (WINcrs). The edge counter 33a counts number of significant transitions (rising edges and falling edges) of the variable clock (CKV) within the pulse of the coarse window signal (WINcrs). The edge counter 33a then outputs its counting value (QALL) to the comparator 33b. The counting value (QALL) is reset to "0" whenever the supplement circuit 3 starts to enter the calibration mode. a3

The comparator 33b receives the counting value (QALL) from the edge counter 33a and receives the threshold value (CNTth). The threshold value (CNTth) can be sent from exterior (for example, a controller). Then, the comparator 33b generates a comparison result to select one of the step counter 33c and the holding circuit 33d. When the predefined condition is not satisfied, the comparison result shows that the step counter 33c is selected. When the predefined condition is satisfied, the comparison result shows that the holding circuit 33d is selected.

The step counter 33c may count in an up-counting manner or a down-counting manner. In a case that the step counter 33c is an up-counting counter, the step value is a positive integer, and the comparator 33b determines the predefined condition is satisfied if the counting value (QALL) is equivalent to or less than the threshold value (CNTth). In a case that the step counter 33c is a down-counting counter, the step value is a negative integer, and the comparator 33b determines the predefined condition is satisfied if the counting value (QALL) is equivalent to or greater than the threshold value (CNTth).

The pulse trimming circuit 35 generates a fine window signal (WINfn) used for trimming the redundant filtered variable clock (active CKV) in the duration of the pulse of the coarse window signal (WINcrs). The usage of the fine window generator 35a ensures number of the CKV signals to be transmitted to the TDC is consistent. In consequence, the TDC can operate in a power efficient manner. Then, the AND logic gate 35b generates the target variable clock (CKVin) according to the fine window signal (WINfn) and the variable clock (CKV).

According to another embodiment of the present disclosure, an auxiliary window generator (not shown) and an auxiliary edge counter (not shown) can be placed in parallel with the coarse window generator 31a and the edge counter 33a. The auxiliary window generator and the auxiliary edge counter are basically a replica of the coarse window generator 31a and the edge counter 33a, respectively.

The auxiliary window generator is used for generating an auxiliary window signal (WINaux). Duration of pulse of the auxiliary window signal (WINaux) and duration of pulse of the coarse window signal (WINcrs) are assumed to be equivalent. The rising edge of the pulse of the auxiliary window signal (WINaux) starts slightly earlier or slightly later than that of the coarse window signal (WINcrs).

Similar to the operation of the edge counter 33a, the auxiliary edge counter counts the number of edges in the duration of pulse of the auxiliary window signal (WINaux) and obtains an auxiliary counting value (QALL'). The auxiliary counting value (QALL') corresponding to the auxiliary window generator is further compared with the counting value (QALL) corresponding to the coarse window generator 31a.

In general cases, the counting value (QALL) and the auxiliary counting value (QALL') are equivalent. If these two counting results (QALL and QALL') are equivalent, the counting value (QALL) can be directly transmitted to the comparator 33b.

In some critical cases, a critical edge (a rising edge or a falling edge) may exist in the slight time difference between the coarse window signal (WINcrs) and the auxiliary window signal (WINaux) so that the critical edge is counted by only one of the edge counter 33a and the auxiliary edge counter. Consequentially, the counting value (QALL) is not equivalent to the auxiliary counting value (QALL'). If the counting value (QALL) is greater than the auxiliary counting value (QALL'), the comparator 33b compares the counting value (QALL) with the threshold value (CNTth). If the auxiliary counting value (QALL') is greater than the counting value (QALL), the comparator 33b compares the auxiliary counting value (QALL') with the threshold value (CNTth). That is, a maximum of these two counting results is selected for determining the predefined condition.

Figure 8:
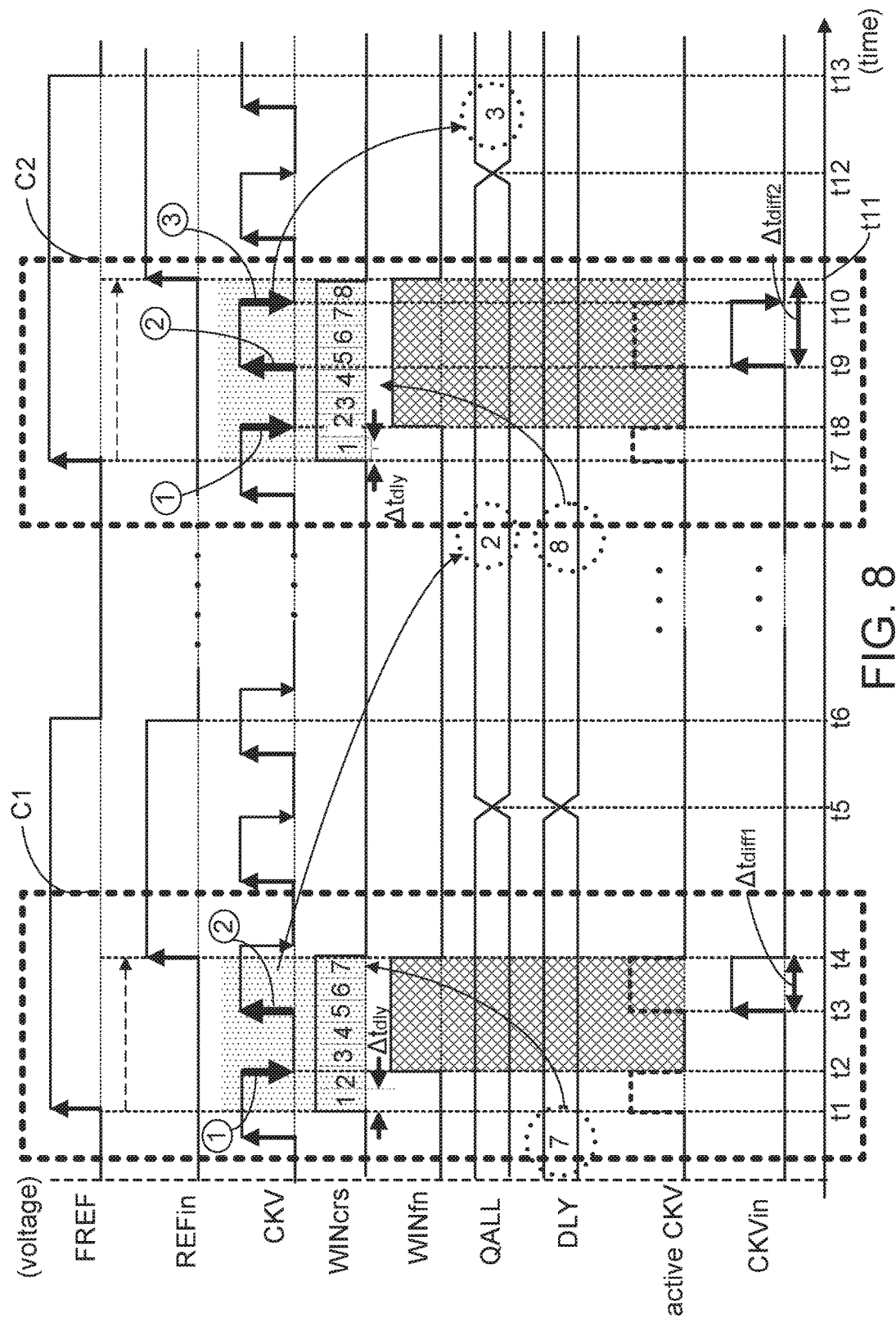
FIG. 8 is a schematic diagram illustrating waveforms of the signals in the supplement circuit.

FIG. 8 is a timing diagram illustrating waveforms of the signals in the supplement circuit. These signals are exemplary signals shown in FIG. 7.

The first row in FIG. 8 is corresponding to the reference clock signal (FREF). The rising edge of the first (left) pulse of the reference clock signal (FREF) occurs at a time point t1, and the falling edge of the same occurs at a time point t6. The rising edge of the second (right) pulse of the reference clock signal (FREF) occurs at a time point t7, and the falling edge of the same occurs at a time point t13.

The second row in FIG. 8 is corresponding to the delayed reference clock signal (REFin). The rising edge of the first (left) delayed reference clock signal (REFin) is at a time point t4, and the falling edge of the same occurs at the time point t6. The rising edge of the second (right) delayed reference clock signal (REFin) occurs at a time point t11 and the falling edge of the same occurs at the time point t13.

The third row and the fourth row in FIG. 8 are respectively corresponding to the variable clock (CKV) and the coarse window signal (WINcrs). For the sake of simplicity, the dotted shading is corresponding to width (duration) of pulse of the coarse window signal (WINcrs). As the circled numbers shown here, there are two significant transitions (edges) of the variable clock (CKV) within the first (left) pulse of the coarse window signal (WINcrs), and there are three transitions (edges) of the variable clock (CKV) within the second (right) pulse of the coarse window signal (WINcrs). The rising edge of the first (left) pulse of the coarse window signal (WINcrs) occurs at the time point t1, and the falling edge of the same occurs at the time point t4. The rising edge of the second (right) pulse of the coarse window signal (WINcrs) occurs at the time point t7 and the falling edge of the same occurs at the time point t11.

The pulses of the coarse window signal (WINcrs) are shown in units of delay unit ($\Delta t_{dly}$). The first pulse of the coarse window signal (WINcrs) is represented as 7 delay units ($|t4-t1|=\Delta t_{dly}*7$), and the second pulse of the coarse window signal (WINcrs) is represented as 8 delay units ($|t11-t7|=\Delta t_{dly}*8$). To precisely allocate the transition of the variable (CKV), the unit delay ($\Delta t_{dly}$) is preferred to be shorter than the cycle of the variable clock (CKV).

The fifth row in FIG. 8 is corresponding to the fine window signal (WINfn). The mesh-like shading is corresponding to width (duration) of pulse of the fine window signal (WINfn). The rising edge of the first pulse of the fine window signal (WINfn) occurs at a time point t2, and the falling edge of the same occurs at the time point t4. The rising edge of the second pulse of the fine window signal (WINfn) occurs at a time point t8 and the falling edge of the same occurs at the time point t11.

The sixth row in FIG. 8 is corresponding to the counting value (QALL). As illustrated above, two edges of the variable clock (CKV) are counted within duration of the first pulse of the coarse window signal (WINcrs). Therefore, the counting value (QALL) between the time point t2 and the time point t4 is equivalent to "2", and the counting value (QALL) is updated to 2 between the time point t5 and a time point t12. Similarly, three edges of the variable clock (CKV) are counted within duration of the second pulse of the coarse window signal (WINcrs). Therefore, the counting value (QALL) between the time point t7 and time point t11 is equivalent to "3", and the counting value (QALL) after the time point t12 is updated to "3".

The seventh row in FIG. 8 is corresponding to the delay count variable (DLY). The delay count variable (DLY) before the time point t5 is "7", and the delay count variable (DLY) after the time point t5 is "8". Because the delay count variable (DLY) increases by a positive step value, "+1", the step counter 33c operates in an up-counting manner. As shown by the left dotted circle and the arrow connected, the delay count variable (DLY) of value "7" is corresponding to the amount of delay units used for generating the width of the first (left) pulse of the coarse window signal (WINcrs). As shown by the right dotted circle and the arrow connected, the delay count variable (DLY) of value "8" is corresponding to the amount of delay units used for generating the width of the second (right) pulse of the coarse window signal (WINcrs).

According to the embodiment of the present disclosure, the threshold value (CNTth) is assumed to be "3". Because the counting value (QALL) is updated to "3" at the time point t12, the predefined condition is determined as satisfied by the comparator 33b after the time point t12. As a result, the delay count variable (DLY) remains unchanged after the time point t12. Moreover, the pulse width of the coarse window signal (WINcrs) remains as 8 unit delays ($\Delta t_{dly}*8$) after the time point t12. Regarding the selection of the threshold value (CNTth), it is preferred to be an odd number (for example, 3 or 5).

The eighth row in FIG. 8 is corresponding to the filtered variable clock (active CKV). The filtered variable clock (active CKV) is obtained by assuming that the coarse window signal (WINcrs) is used to suppress the pulses of the variable clock (CKV). The filtered variable clock (active CKV) is not physically shown in the supplement circuit 3 in FIG. 7 but listed here for comparison purpose.

The ninth row in FIG. 8 is corresponding to the target variable clock (CKVin). The rising edge of the first target variable clock (CKVin) occurs at a time point t3, and the falling edge of the same occurs at the time point t4. The rising edge of the second target variable (CKVin) occurs at a time point t9, and the falling edge of the same occurs at a time point t10.

Two rounds of the calibration procedure are demonstrated as the dotted block rectangles in FIG. 8. In the first round of the calibration procedure (C1), the first pulse of the target variable clock (CKVin) at the time point t3, and the rising edge of the first delayed reference signal (FREF) at the time point t4 are received by the TDC. Accordingly, the TDC produces a first TDC signal representing the first time difference ($\Delta t_{diff1}$=t4–t3). In the second round of the calibration procedure (C2), the second pulse of the target variable clock (CKVin) at the time point t9, and the rising edge of the second delayed reference signal (FREF) at the time point t11 are received by the TDC. Accordingly, the TDC produces a second TDC signal representing the second time difference ($\Delta t_{diff2}$=t11–t9).

FIGS. 9A, 9B, 10A and 10B are examples illustrating why the threshold value is preferred to be odd number. In FIGS. 9A, 9B, 10A and 10B, the rising edge of the pulse coarse window signal (WINcrs) is assumed to be synchronous with a negative edge of the variable clock (CKV). Thus, the negative edge of the variable clock (CKV) corresponding to the rising edge of the coarse window signal may or may not be not defined as beginning of the fine window signal (WINfn). Details about how the target variable clock (CKVin) is generated based on the variable clock (CKV) and the fine window signal (WINfn) are similar to the illustrations above and not redundantly repeated.

Figure 9A:
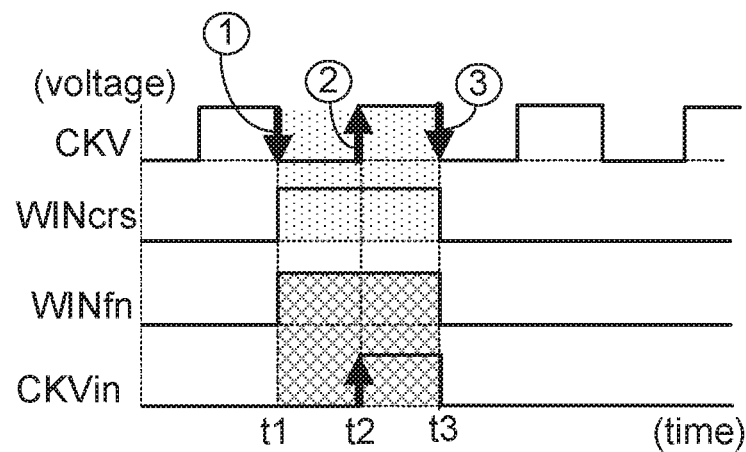
FIGS. 9A and 9B are schematic diagrams illustrating the fine window in two extreme cases if an odd number is selected as the threshold value.
Figure 9B:
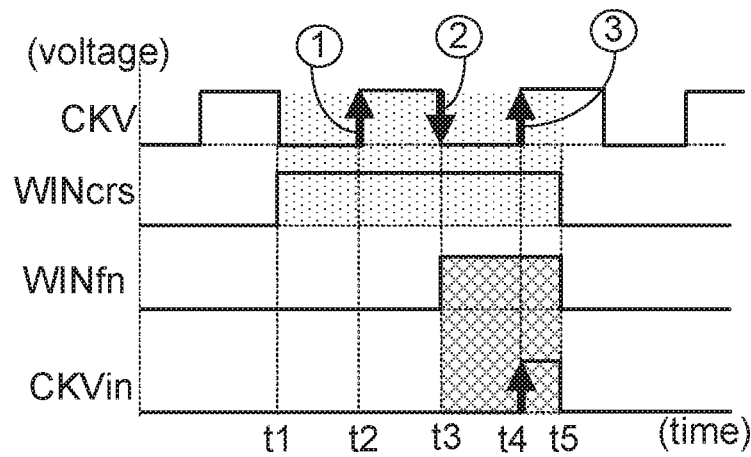

FIGS. 9A and 9B are schematic diagrams illustrating an odd number is selected as the threshold value. If the threshold value (CNTth) is set as an odd number and the predefined condition is satisfied, the number of the pulses of the target variable clock (CKVin) remains consistent in two extreme cases.

FIG. 9A is corresponding to the case that the first falling edge of the variable clock (CKV) (occurs at a time point t1) is defined as beginning of the pulse of the fine window signal (WINfn). Therefore, duration of pulse of the fine window signal (WINfn) is equivalent to duration of pulse of the coarse window signal (WINcrs) in FIG. 9A. A rising edge of the target variable clock (CKVin) occurs at a time point t2. As a result, the TDC receives one pulse of the target variable clock (CKVin).

FIG. 9B is corresponding to the case that the first falling edge of the variable clock (CKV) (occurs at a time point t1) is not defined as beginning of the pulse of the fine window signal (WINfn). Therefore, duration of the pulse of the fine window signal (WINfn) is shorter than duration of the coarse window signal (WINcrs) in FIG. 10B. A rising edge of the target variable clock (CKVin) occurs at a time point t4. As a result, the TDC receives one pulse of the target variable clock (CKVin).

As demonstrated in FIGS. 9A and 9B, when the threshold value (CNTth) is set as an odd number, the number of pulses of the target variable clock can remain consistent regardless whether the first falling edge of the variable clock (CKV) is counted or not.

Figure 10A:
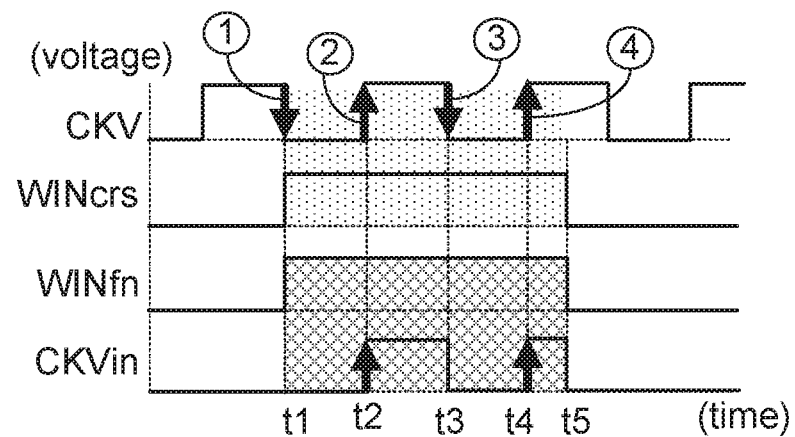
FIGS. 10A and 10B are schematic diagrams illustrating the fine window in two extreme cases if an even number is selected as the threshold value.
Figure 10B:
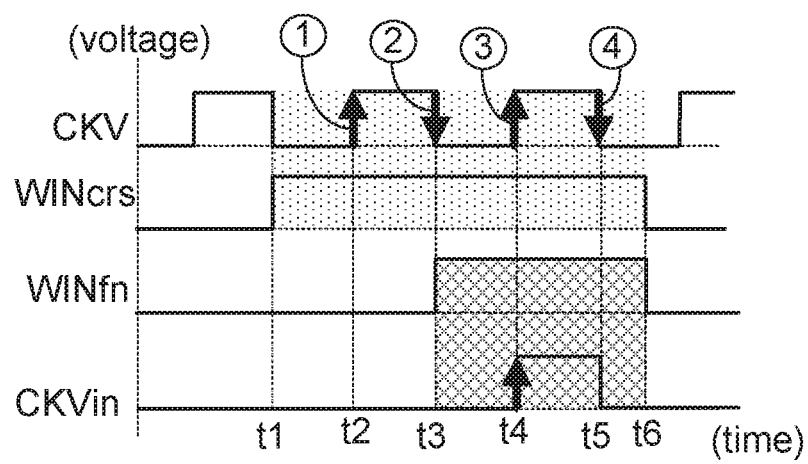

FIGS. 10A and 10B are schematic diagrams illustrating an even number is selected as the threshold value. If the threshold value (CNTth) is set as an even number and the predefined condition is satisfied, the number of the pulses of the target variable clock (CKVin) may vary in two extreme cases.

FIG. 10A is corresponding to the case that the first falling edge of the variable clock (CKV) (occurs at a time point t1) is defined as beginning of the pulse of the fine window signal (WINfn). Therefore, duration of the pulse of the fine window signal (WINfn) is equivalent to duration of the coarse window signal (WINcrs) in FIG. 10A. A rising edge of the target variable clock (CKVin) occurs at a time point t2 and another rising edge of the target variable clock (CKVin) occurs at a time point t4. As a result, the TDC receives two pulses of the target variable clock (CKVin).

FIG. 10B is corresponding to the case that the first falling edge of the variable clock (CKV) (occurs at a time point t1) is not defined as beginning of the pulse of the fine window signal (WINfn). Therefore, duration of the pulse of the fine window signal (WINfn) is shorter than duration of the coarse window signal (WINcrs) in FIG. 10B. A rising edge of the target variable clock (CKVin) occurs at a time point t4. As a result, the TDC receives one pulse of the target variable clock (CKVin).

As demonstrated in FIGS. 10A and 10B, when the threshold value (CNTth) is set as an even number, the number of pulses of the target variable clock may not be consistent in extreme cases. If the first falling edge is counted by the edge counter, the TDC will receive more pulse of the target variable clock (CKVin). Consequently, operation of the TDC may be interfered because of such fluctuation and inconsistency.

Two extreme cases of generation of the fine window single (WINfn) are discussed above. In the first extreme case, such as FIGS. 9A and 10A, the fine window signal (WINfn) generated immediately at the same time as the coarse window signal (WINcrs) because the first negative edge of the variable clock (CKV) is successfully counted by the edge counter. In the second extreme case, such as FIGS. 9B and 10B, generation of the fine window signal (WINfn) is a period of CKV signal after generation of the coarse window signal (WINcrs) because the first negative edge of the variable clock (CKV) is not counted by the edge counter.

A supplement circuit having dynamic pulse suppressing function for TDC is provided. In the calibration mode, the supplement circuit recursively executes the above calibration procedure until the predefined condition is satisfied. By providing the adjustable pulse width of the two filter windows (including the coarse window and the fine window), unnecessary pulses of the variable clock (CKV) before a subsequent rising edge of the reference clock (FREF) can be freely suppressed regardless frequency change of any of the CKV and REF. Thus, the power consumption of the TDC can be reduced and linearly of the TDC can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A time-to-digital system, for receiving a reference clock signal and a variable clock, wherein a frequency of the variable clock is higher than a frequency of the reference clock signal, comprising:

a supplement circuit, for generating a delayed reference clock signal and at least one pulse in response to the variable clock ahead of a transition of the delayed reference clock signal, wherein the delayed reference clock signal is generated according to the reference clock signal and a delay control signal which is determined in response to transitions of the variable clock, wherein the supplement circuit comprises:

a window generation circuit, for generating the delayed reference clock signal and a first window signal according to the delay control signal, wherein the window generation circuit comprises:
a programmable delay circuit, for receiving the delay control signal and accordingly generating a delay count variable, wherein the delay count variable is corresponding to a delay duration; and
a first window generator, coupled to the programmable delay circuit, for generating the delayed reference clock signal by reproducing the reference clock signal after the delay duration; and
a window evaluator, coupled to the programmable delay circuit, for evaluating the first window signal based on the transitions of the variable clock, and accordingly generating the delay control signal; and
a time-to-digital converter (TDC), coupled to the supplement circuit, for receiving the delayed reference clock signal and the at least one pulse in response to the variable clock and accordingly producing a TDC signal.

2. The time-to-digital system according to claim 1, wherein the delay duration is equivalent to a unit delay times the delay count variable.

3. The time-to-digital system according to claim 2, wherein the unit delay is shorter than a cycle of the variable clock.

4. The time-to-digital system according to claim 1, wherein duration of the first window signal is equivalent to the delay duration.

5. The time-to-digital system according to claim 1, wherein the window evaluator comprises:
an edge counter, coupled to the window generation circuit, for receiving the variable clock and the first window signal, wherein the edge counter starts counting the transitions of the variable clock when the first window signal transits from a first level to a second level, stops counting the transitions of the variable clock when the first window signal transits from the second level to the first level, and accordingly generates a counting value; and
a determination circuit, coupled to the edge counter and the window generation circuit, for generating the delay control signal according to the counting value.

6. The time-to-digital system according to claim 5, wherein the determination circuit comprises:
a comparator, for comparing the counting value with a threshold value to generate a comparison result.

7. The time-to-digital system according to claim 6, wherein the threshold value is an odd integer.

8. The time-to-digital system according to claim 7, wherein the threshold value is 3 or 5.

9. The time-to-digital system according to claim 6, wherein the determination circuit further comprises:
a step counter, coupled to the comparator and the window generation circuit, for generating the delay control signal if the comparison result indicates a first condition; and
a holding circuit, coupled to the comparator and the window generation circuit, for generating the delay control signal if the comparison result indicates a second condition.

10. The time-to-digital system according to claim 9, wherein
the step counter generates the delay control signal so that the delay count variable is changed with a step value; and
the holding circuit generates the delay control signal so that the delay count variable remains unchanged.

11. The time-to-digital system according to claim 10, wherein
the step value is a positive integer if the step counter operates in an up-counting manner; and
the step value is a negative integer if the step counter operates in a down-counting manner.

12. The time-to-digital system according to claim 1, wherein the supplement circuit comprises:
a pulse trimming circuit, coupled to the time-to-digital converter, for generating the at least one pulse in response to the variable clock according to the variable clock and a first window signal.

13. The time-to-digital system according to claim 12, wherein the pulse trimming circuit comprises:
a second window generator, for generating a second window signal according to the first window signal and an inversed variable clock, wherein the inversed variable clock is generated according to the variable clock.

14. The time-to-digital system according to claim 13, wherein duration of the second window signal is shorter than or equivalent to duration of the first window signal.

15. The time-to-digital system according to claim 13, wherein the pulse trimming circuit further comprises:
a logic gate, coupled to the second window generator and the time-to-digital converter, wherein
the logic gate starts outputting the at least one pulse in response to the variable clock when the second window signal transits from a first level to a second level, and
the logic gate stops outputting the at least one pulse in response to the variable clock to the time-to-digital converter when the second window signal transits from the second level to the first level.

16. A frequency synthesizer, comprising:
a supplement circuit, for receiving a reference clock signal and a variable clock, and generating a delayed reference clock signal and at least one pulse in response to the variable clock ahead of a transition of the delayed reference clock signal, wherein the delayed reference clock signal is generated according to the reference clock signal and a delay control signal which is determined in response to transitions of the variable clock, and a frequency of the variable clock is higher than a frequency of the reference clock signal, wherein the supplement circuit comprises:
a window generation circuit, for generating the delayed reference clock signal and a first window signal according to the delay control signal; and
a window evaluator, coupled to the window generation circuit, for evaluating the first window signal based on a transition of the variable clock, and accordingly generating the delay control signal; and
a time-to-digital converter (TDC), coupled to the supplement circuit, for receiving the delayed reference clock signal and the at least one pulse in response to the variable clock and accordingly producing a TDC signal.

17. The frequency synthesizer according to claim 16, wherein the supplement circuit comprises:
a pulse trimming circuit, coupled to the time-to-digital converter, for generating the at least one pulse in response to the variable clock and a first window signal.

18. The frequency synthesizer according to claim 16, further comprising:
an oscillator, coupled to the supplement circuit, for generating the variable clock.

19. A time-to-digital system, for receiving a reference clock signal and a variable clock, wherein a frequency of the variable clock is higher than a frequency of the reference clock signal, comprising:
- a supplement circuit, comprising:
 - a window generation circuit, comprising:
   - a programmable delay circuit, for receiving a delay control signal and accordingly generating a delay count variable, wherein the window generation circuit generates a delayed reference clock signal and a first window signal according to the delay control signal, and the delay count variable corresponds to a delay duration of the delayed reference clock signal; and
   - a window evaluator, coupled to the programmable delay circuit, for evaluating the first window signal based on the transitions of the variable clock, and accordingly generating the delay control signal, wherein the window generation circuit receives the delay control signal from the window evaluator to generate the delayed reference clock signal based on the reference clock signal and the delay control signal; and
- a time-to-digital converter (TDC), coupled to the supplement circuit, for receiving the delayed reference clock signal and at least one pulse in response to the variable clock ahead of a transition of the delayed reference clock signal and accordingly producing a TDC signal.

20. The time-to-digital system according to claim 19, wherein the window generation circuit further comprises:
- a first window generator, coupled to the programmable delay circuit, for generating the delayed reference clock signal by reproducing the reference clock signal after the delay duration.

* * * * *